United States Patent
Hong

(10) Patent No.: US 8,432,179 B2
(45) Date of Patent: Apr. 30, 2013

(54) TEST DEVICE FOR TESTING TRANSISTOR CHARACTERISTICS IN SEMICONDUCTOR INTEGRATED CIRCUIT

(75) Inventor: Yun Seok Hong, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 274 days.

(21) Appl. No.: 12/843,854

(22) Filed: Jul. 26, 2010

(65) Prior Publication Data
US 2011/0025366 A1 Feb. 3, 2011

(30) Foreign Application Priority Data
Jul. 30, 2009 (KR) .................. 10-2009-0070193

(51) Int. Cl.
*G01R 31/26* (2006.01)
(52) U.S. Cl.
USPC .................................................. 324/762.01
(58) Field of Classification Search .. 324/762.01–762.1, 324/750.01–750.3; 331/57; 257/48; 438/14–18; 702/117, 191
See application file for complete search history.

(56) References Cited

U.S. PATENT DOCUMENTS

| | | | |
|---|---|---|---|
| 5,263,031 A | 11/1993 | Inoue | |
| 5,687,180 A | 11/1997 | Kawasaki | |
| 5,901,105 A | 5/1999 | Ong et al. | |
| 6,239,603 B1 * | 5/2001 | Ukei et al. | 324/750.3 |
| 6,925,404 B2 * | 8/2005 | Corr | 702/117 |
| 6,940,765 B2 | 9/2005 | Kyung | |
| 7,265,639 B2 * | 9/2007 | Bhushan et al. | 331/57 |

FOREIGN PATENT DOCUMENTS

| | | |
|---|---|---|
| JP | 09-106698 | 4/1997 |
| JP | 2005-071582 | 3/2005 |
| KR | 1019960032904 A | 9/1996 |
| KR | 1019990080891 A | 11/1999 |
| KR | 1020070039416 A | 4/2007 |
| KR | 1020090056286 A | 6/2009 |

\* cited by examiner

*Primary Examiner* — Tung X Nguyen
(74) *Attorney, Agent, or Firm* — William Park & Associates Ltd.

(57) ABSTRACT

A test device of a semiconductor integrated circuit includes: an oscillation unit including a plurality of oscillation circuits and configured to activate the respective oscillation circuits in response to a test mode signal and output a plurality of oscillation signals; a switching unit configured to extract only an activated signal among the plurality of oscillation signals; a frequency division unit configured to divide a signal outputted from the switching unit at a predetermined division ratio and generate a divided oscillation signal; and a data buffer unit configured to buffer the divided oscillation signal to output through a data pad.

11 Claims, 5 Drawing Sheets

TEST DEVICE FOR TESTING TRANSISTOR CHARACTERISTICS IN SEMICONDUCTOR INTEGRATED CIRCUIT

CROSS-REFERENCES TO RELATED APPLICATION

The present application claims priority under 35 U.S.C. §119(a) to Korean application number 10-2009-0070193, filed on Jul. 30, 2009, in the Korean Intellectual Property Office, which is incorporated herein by reference in its entirety as set forth in full.

BACKGROUND

1. Technical Field

The present invention relates to a semiconductor memory apparatus, and more particularly to a test device of a semiconductor integrated circuit.

2. Related Art

Ordinarily, testing is a necessary step in a semiconductor integrated circuit manufacturing process, because the simulation results used in the design may be different from the way a chip operates in an actual product. Accordingly, to reduce defect rate, various kinds of tests are typically performed in the semiconductor integrated circuit manufacturing process.

As a semiconductor integrated circuit includes a large number of transistors, testing whether each of the transistors can or cannot sufficiently exhibit the designed performance is considered an important process. In particular, as the semiconductor integrated circuits are designed to be increasingly smaller in size and higher in speed, any minute difference occurring in the manufacturing process may cause defects more frequently. This makes it necessary to test whether or not the transistors can normally perform their designed functions as expected in the design step.

SUMMARY

A test device of a semiconductor integrated circuit, which is capable of outputting a performance test result of transistors by using one data pad, is described herein.

In an embodiment of the present invention, a test device of a semiconductor integrated circuit includes: an oscillation unit comprising a plurality of oscillation circuits capable of outputting a plurality of oscillation signals, wherein one or more of the oscillation signals is activated in response to one or more test mode signals; a switching unit receiving the plurality of oscillation signals and extracting an activated oscillation signal among the plurality of oscillation signals; a frequency division unit configured to divide a signal outputted from the switching unit at a predetermined division ratio and generate a divided oscillation signal; and a data buffer unit configured to buffer the divided oscillation signal to output through a data pad.

In another embodiment of the present invention, a test device of a semiconductor integrated circuit includes: a first oscillation circuit configured to generate a first oscillation signal in response to a first test mode signal; a second oscillation circuit configured to generate a second oscillation signal in response to a second test mode signal; a frequency division unit configured to divide the first oscillation signal at a first division ratio to generate a divided oscillation signal, when the first test mode signal is enabled, and divide the second oscillation signal at a second division ratio to generate the divide oscillation signal, when the second test mode signal is enabled; and a data buffer unit configured to buffer the divided oscillation signal to output through a data pad.

BRIEF DESCRIPTION OF THE DRAWINGS

Features, aspects, and embodiments are described in conjunction with the attached drawings, in which.

DETAILED DESCRIPTION

Hereinafter, a test device of a semiconductor integrated circuit according to an embodiment the present invention will be described below with reference to the accompanying drawings through preferred embodiments.

Figure 1:
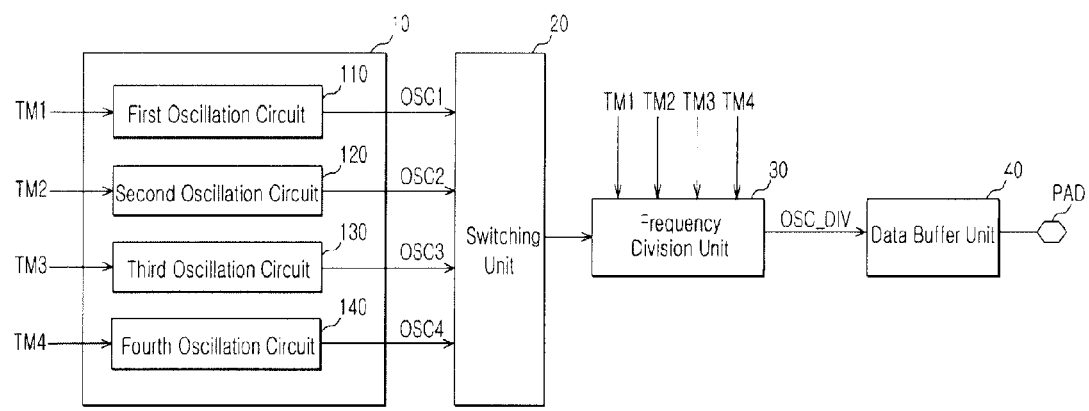
FIG. 1 is a block diagram illustrating the configuration of a test device of a semiconductor integrated circuit according to an embodiment of the present invention.

FIG. 1 is a block diagram illustrating the configuration of a test device of a semiconductor integrated circuit according to an embodiment of the present invention.

Referring to FIG. 1, the test device of the semiconductor integrated circuit according to an embodiment of the present invention includes an oscillation unit 10, a switching unit 20, a frequency division unit 30, and a data buffer unit 40. The oscillation unit 10 is configured to generate first through fourth oscillation signals OSC1, OSC2, OSC3, OSC4 in response to first through fourth test mode signals TM1, TM2, TM3, TM4. The switching unit 20 is configured to select and output only an activated signal among the first through fourth oscillation signals OSC1, OSC2, OSC3, OSC4 received from the oscillation unit 10. The frequency division unit 30 is configured to divide the signal outputted from the switching unit 20 at a predetermined division ratio in response to the first through fourth test mode signals TM1, TM2, TM3, TM4, and generate a divided oscillation signal OCS_DIV. The data buffer unit 40 is configured to buffer the divided oscillation signal OSC_DIV to output through a data pad PAD.

The oscillation unit 10 includes first through fourth oscillation circuits 110, 120, 130, 140. The first through fourth oscillation circuits 110, 120, 130, 140 are activated in response to the first through fourth test mode signals TM1, TM2, TM3, TM4, respectively. The first through fourth oscillation circuits 110, 120, 130, 140 include elements having different characteristics, and thus generate the oscillation signals OSC1, OSC2, OSC3, OSC4 having different frequencies. The first through fourth test mode signals TM1, TM2, TM3, TM4 are enabled one by one. Therefore, all of the first through fourth test mode signals TM1, TM2, TM3, TM4 are not activated at the same time. That is, each of the first through fourth oscillation circuit 110, 120, 130, 140 is activated separately in accordance with control of the first through fourth test mode signals TM1, TM2, TM3, TM4. Accordingly, only one of the first through fourth oscillation signals OSC1, OSC2, OSC3, OSC4 is activated for each test. The other signals that are not activated may remain at a predetermined constant level, such as a high level.

The switching unit 20 extracts and outputs only the activated one of the first through fourth oscillation signals OCS1, OSC2, OSC3, OSC4. After that, the frequency division unit 30 divides the activated oscillation signal received from the switching unit 20 at a predetermined division ratio to generate the divided oscillation signal OSC_DIV. At this time, the division ratio to be applied by the frequency division unit 30 may be different depending on the frequency of the oscillation signal from the switching unit 20. That is, a larger division ratio could be applied for a higher frequency oscillation signal. For example, when the first oscillation signal OSC1 has a frequency several times to several ten times higher than that of the fourth oscillation signal OCS4, the first oscillation signal OSC1 would be applied with a larger division ratio than that applied to the fourth oscillation signal OCS4. Then, when determining the frequency of the divided oscillation signal OSC_DIV from outside, it becomes possible to monitor within a predetermined frequency band, which enables to perform the test more effectively.

The divided oscillation signal OSC_DIV is buffered by the data buffer unit 40 and then outputted through the data pad PAD. The signal outputted through the data pad PAD is used by a tester to determine the frequency, from which the tester may understand the operational characteristics of the respective oscillation circuits inside the oscillation circuit 10 and thereby monitor the performance characteristics of the transistors.

One way to implement the frequency division unit 30 would be by utilizing the configuration for generating a refresh signal. That is, a circuit for generating a refresh signal is typically configured to generate a low frequency pulse signal by dividing an arbitrary pulse signal at a predetermined division ratio, and then set a refresh period using the generated pulse signal. Such a configuration for generating a refresh signal may be used to realize the frequency division unit 30 according to an embodiment of the present invention. To implement such a configuration, other additional supplemental features may be needed, but their details are not described in detail as it would not affect the spirit and scope of the present invention. Using such a configuration, the test device of the semiconductor integrated circuit according to an embodiment of the present invention produces the desirous advantages of not causing increased circuit area for the test device.

FIGS. 2A through 2D are configuration diagrams of the first through fourth oscillation circuits illustrated in FIG. 1.

Figure 2A:
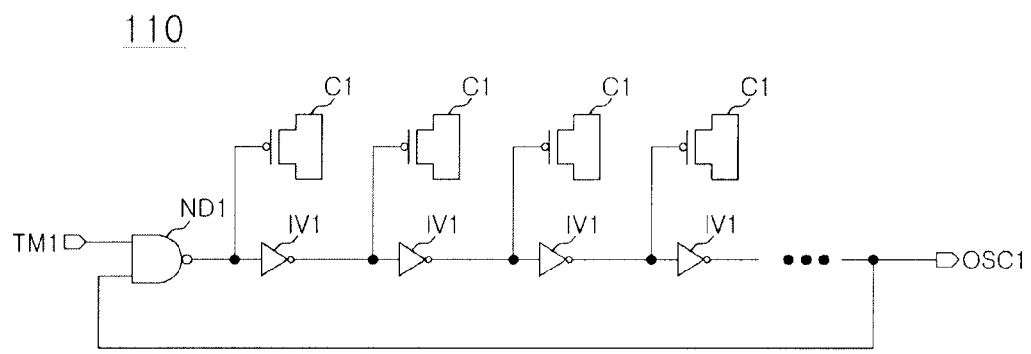
FIGS. 2A through 2D are configuration diagrams of first through fourth oscillation circuits 110, 120, 130, 140 shown in FIG. 1.

Referring to FIG. 2A, the first oscillation circuit 110 has a feedback loop structure including an even number of inverters IV1 connected in series to a NAND gate ND1. A capacitor C1 is provided to between the NAND gate ND1 and the first inverter IV1 and between every two serially connected inverters IV1 subsequent to the first inverter IV1. It is noted that a capacitor C1 is not connected to the connection between the last serially connected pair of IV1s in FIG. 2A as the last pair of IV1s are outside the feedback loop. [질문: 도2A 상에는 마지막 2개의IV1 사이에는 C1 이 컨넥트 되있지 않음 .] The first oscillation circuit 110 configured in such a manner generates the first oscillation signal OCS1 having a predetermined period when the first test mode signal TM1 is enabled. The period of the first oscillation signal OCS1 is then determined depending on the delay amounts of the capacitors C1.

Figure 2B:
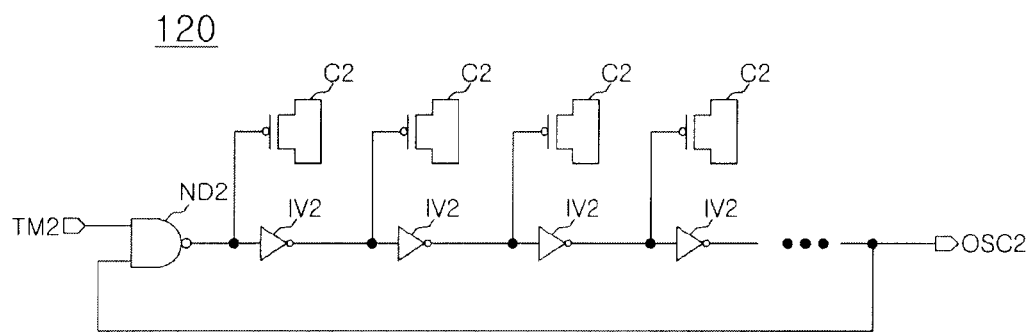

Referring to FIG. 2B, the second oscillation circuit 120 includes a NAND gate ND2, a plurality of inverters IV2, and a plurality of capacitors C2, and has a similar structure to the first oscillation circuit 110 as shown in FIG. 2A. However, when it is assumed that the capacitors C1 of the first oscillation circuit 110 of FIG. 2A are implemented as slim transistors and the capacitors C2 of the second oscillation circuit 120 of FIG. 2B are implemented as thick transistors, then the second oscillation signal OCS2 generated by the second oscillation circuit 120 of FIG. 2 would have a longer period than the first oscillation signal OSC1 of FIG. 1.

Figure 2C:
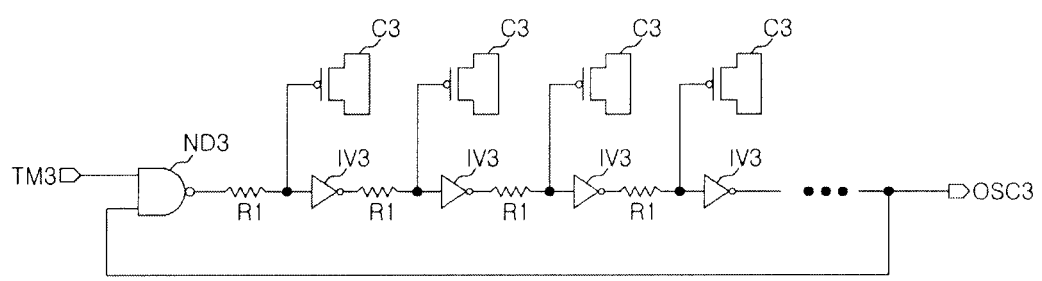

Referring to FIG. 2C, the third oscillation circuit 130 has a feedback loop structure including an even number of inverters IV3 connected in series to a NAND gate ND3. Between the NAND gate ND3 and the first inverter IV3 and between the respective inverters IV3, resistors R1 and capacitors C3 are provided (except for the last two IV3s that are outside the feedback loop). The plurality of resistors R1 and the plurality of capacitors C3 form a plurality of RC-delays. The third oscillation circuit 130 configured in such a manner generates the third oscillation signal OCS3 having a predetermined period when the third test mode signal TM3 is enabled. At this time, the period of the generated third oscillation signal OCS3 is determined by the plurality of RC-delays. Even when the number of inverters IV3 of the third oscillation circuit 130 is equal to the number of inverters IV1 of the first oscillation circuit 110, the period of the third oscillation signal OCS3 is increased more than the period of the first oscillation signal OCS1 by the above-described RC-delays.

Figure 2D:
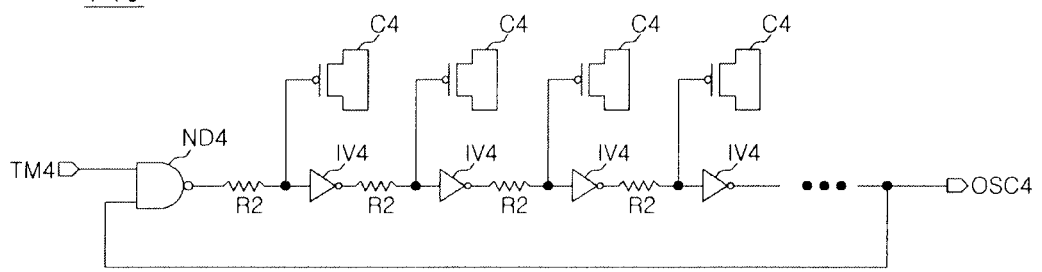

Referring to FIG. 2D, the fourth oscillation circuit 140 includes a NAND gate ND4, a plurality of inverters IV4, a plurality of resistors R2, and a plurality of capacitors C4, and has a similar structure to the third oscillation circuit 130 of FIG. 2C. When it is assumed that the capacitors C3 of the third oscillation circuit 130 are implemented as slim transistors and the capacitors C4 of the fourth oscillation circuit 140 are implemented as thick transistors, the fourth oscillation signal OSC4 generated by the fourth oscillation circuit 140 may have a longer period than the third oscillation circuit OCS3. Furthermore, it can be inferred that the period of the fourth oscillation signal OCS4 is increased so that its period is greater than the period of the third oscillation signal OCS3 by the RC-delays included in the fourth oscillation circuit 140.

Figure 3:
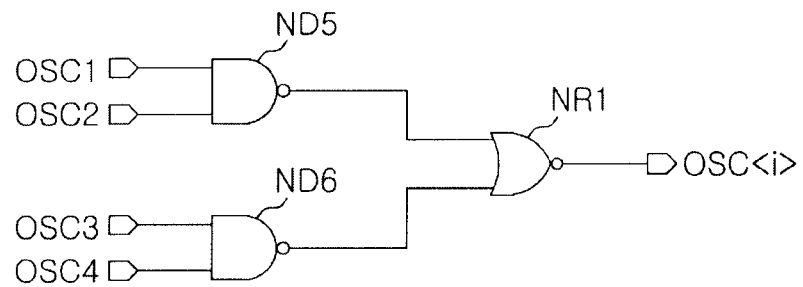
FIG. 3 is a detailed configuration diagram of a switching unit 20 shown in FIG. 1.

FIG. 3 is a detailed configuration diagram of the switching unit 20 as shown in FIG. 1.

Referring to FIG. 3, the switching unit 20 may be implemented as a combination of two NAND gates ND5, ND6 and a NOR gate NR1. The switching unit 20 configured in such a manner generates a low-level signal, when all of the first through fourth oscillation signals OCS1, OSC2, OSC3, OCS4 have a high-level potential. However, when any one of the first through fourth oscillation signals OCS1, OSC2, OSC3, OCS4 is activated and periodically toggled, the switching unit 20 would then drive the activated signal in a non-inverting manner to output an oscillation signal OCS<i>.

Figure 4:
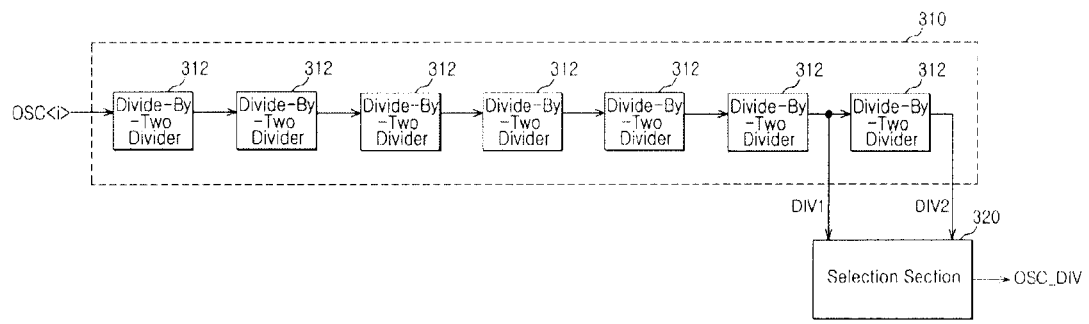
FIG. 4 is a detailed configuration diagram of a frequency division unit 30 shown in FIG. 1.

FIG. 4 is a detailed configuration diagram of the frequency division unit 30 illustrated in FIG. 1.

Referring to FIG. 4, the frequency division unit 30 includes a division section 310 and a selection section 320. The division section 310 is configured to divide the oscillation signal OCS<i> transferred from the switching unit 20 at first and second division ratios to generate first and second divided signals DIV1 and DIV2. The selection section 320 is configured to selectively output the first or second divided signal DIV1 or DIV2 as the divided oscillation signal OCS_DIV in response to the first through fourth test mode signals TM1, TM2, TM3, TM4.

Referring to FIG. 4, the division section 310 may include eight divide-by-two dividers 312 connected in series. In this case, the first divided signal DIV1 is outputted from the seventh divide-by-two divider 312, and the second divided signal DIV2 is outputted from the eighth divide-by-two dividers 312. The first divided signal DIV1 is implemented as a signal having a period 128 times larger than that of the oscillation signal OCS<i>, and the second divided signal DIV2 is implemented as a signal having a period 256 times larger than that of the oscillation signal OCS<i>.

Figure 5:
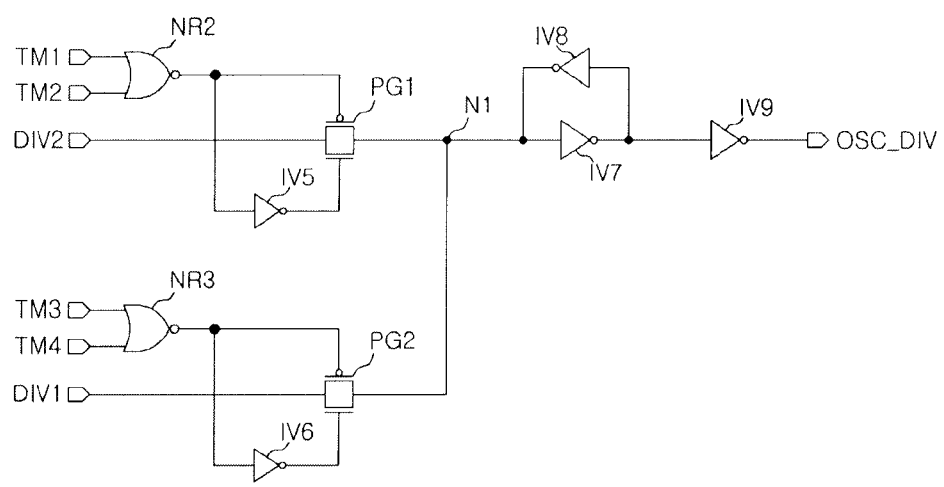
FIG. 5 is a detailed configuration diagram of a selection section 320 illustrated in FIG. 4.

FIG. 5 is a detailed configuration diagram of the selection section 320 illustrated in FIG. 4.

Referring to FIG. 5, the selection section 320 includes a first NOR gate NR2, a first inverter IV5, a first pass gate PG1, a second NOR gate NR3, a second inverter IV6, a second pass gate PG2, a third inverter IV7, a fourth inverter IV8, and a fifth inverter IV9. The first NOR gate NR2 is configured to receive the first and second test mode signals TM1, TM2. The first inverter IV5 is configured to receive an output signal of the first NOR gate NR2. The first pass gate PG1 is configured to transfer the second divided signal DIV2 to a first node N1 in response to the output signal of the first NOR gate NR2 and an output signal of the first inverter IV5. The second NOR gate NR3 is configured to receive the third and fourth test mode signals TM3, TM4. The second inverter IV6 is configured to receive an output signal of the second NOR gate NR3. The second pass gate PG2 is configured to transfer the first divided signal DIV1 to the first node N1 in response to the output signal of the second NOR gate NR3 and the output signal of the second inverter IV6. The third inverter IV7 is configured to receive a potential formed in the first node N1. The fourth inverter IV8 is configured to form a latch structure with the third inverter IV7. The fifth inverter IV9 is configured to receive an output signal of the third inverter IV7 to output the divided oscillation signal OCS_DIV.

In such a configuration, when the first or second test mode signal TM1 or TM2 is enabled, that is, when the first or second oscillation signal OSC1 or OSC2 is activated, the selection section 320 drives in a non-inverting manner the second divided signal DIV2 to output as the divided oscillation signal OCC_DIV. On the other hand, when the third or fourth test mode signal TM3 or TM4 is enabled, that is, when the third or fourth oscillation signal OSC3 or OSC4 is activated, the selection section 320 drives in a non-inverting manner the first divided signal DIV1 to output as the divided oscillation signal OSC_DIV.

As described above, the first and second oscillation signals OSC1, OSC2 have a much shorter period than the third and fourth oscillation signals OSC3, OSC4. Therefore, when the first or second oscillation signal OSC1 or OSC2 is activated and implemented as the oscillation signal OSC<i>, the corresponding division operation is performed. In this case, however, the divide-by-two division operation is performed one more time to output the oscillation signal OSC<i> as the divided oscillation signal OSC_DIV, compared with when the third or fourth oscillation signal OSC3 or OSC4 is activated and implemented as the oscillation signal OSC<i>. Accordingly, the tester receiving the divided oscillation signal OSC_DIV through the data pad PAD may perform an operation of determining the period of the divided oscillation signal OSC_DIV within a predetermined frequency band.

As such, the tester may enable the first through fourth test mode signals TM1, TM2, TM3, TM4 and determine the period of the divided oscillation signal OSC_DIV outputted through the data pad PAD. In each case, the tester may monitor the performances of the transistors inside the semiconductor integrated circuit depending on whether the frequency of the divided oscillation signal OSC_DIV is higher or lower than expected.

As described above, the test device of the semiconductor integrated circuit according to an embodiment of the present invention is configured to generate a plurality of oscillation signals having different frequencies using the plurality of oscillation circuits and frequency-divides one of the oscillation signals to output to the outside through the data pad. Therefore, the frequency of the signal outputted through the data pad may be determined to understand the performances of the transistors inside the semiconductor integrated circuit. Furthermore, it is possible to monitor whether or not the transistors perform the processes normally.

While certain embodiments have been described above, it will be understood to those skilled in the art that the embodiments described are by way of example only. Accordingly, the test device of the semiconductor integrated circuit described herein should not be limited based on the described embodiments. Rather, the test device of the semiconductor integrated circuit described herein should only be limited in light of the claims that follow when taken in conjunction with the above description and accompanying drawings.

What is claimed is:

1. A test device of a semiconductor integrated circuit, comprising:
    an oscillation unit comprising a plurality of oscillation circuits capable of outputting a plurality of oscillation signals, wherein the plurality of oscillation circuits are selectively activated in response to one or more test mode signals, and one or more of the oscillation signals is activated by selectively activating the plurality of oscillation circuits;
    a switching unit receiving the plurality of oscillation signals and extracting an activated oscillation signal among the plurality of oscillation signals;
    a frequency division unit configured to divide a signal outputted from the switching unit at a predetermined division ratio and generate a divided oscillation signal; and
    a data buffer unit configured to buffer the divided oscillation signal to output through a data pad
    wherein the frequency division unit varies the predetermined division ratio in response to the test mode signals.

2. The test device according to claim 1, wherein each of the plurality of oscillation circuits comprises elements having characteristics that are different from each other so as to generate an oscillation signal having a frequency different from the oscillation signals generated by the other oscillation circuits.

3. The test device according to claim 1, wherein the plurality of oscillation circuits are activated for each test in accordance with control of the test mode signals.

4. The test device according to claim 3, wherein the test mode signals are controlled such that only one test mode signal is applied at a given time to generate only on one active oscillation signal.

5. The test device according to claim 4, wherein the frequency division unit comprises:
    a division section configured to divide the active oscillation signal received from the switching unit at first and second division ratios and generate first and second divided signals; and
    a selection section configured to selectively output the first or second divided signal as the divided oscillation signal in response to the test mode signal.

6. The test device according to claim 2, wherein the plurality of oscillation circuits are activated for each test in accordance with control of the test mode signals.

7. The test device according to claim 5, wherein the test mode signals are controlled such that only one test mode signal is applied at a given time to generate only on one active oscillation signal.

8. The test device according to claim 7, wherein the frequency division unit comprises:

a division section configured to divide the activated signal received from the switching unit at first and second division ratios and generate first and second divided signals; and a selection section configured to selectively output the first or second divided signal as the divided oscillation signal in response to the test mode signal.

9. A test device of a semiconductor integrated circuit, comprising:

a first oscillation circuit configured to generate a first oscillation signal in response to a first test mode signal;

a second oscillation circuit configured to generate a second oscillation signal in response to a second test mode signal;

a frequency division unit configured to divide the first oscillation signal at a first division ratio to generate a divided oscillation signal, when the first test mode signal is enabled, and divide the second oscillation signal at a second division ratio to generate the divide oscillation signal, when the second test mode signal is enabled; and a data buffer unit configured to buffer the divided oscillation signal to output through a data pad wherein the frequency division unit selectively outputs one of a signal divided at the first division ratio and a signal divided at the second division ratio as the divided oscillation signal in response to the first test mode signal and the second test mode signal.

10. The test device according to claim 9, wherein each of the first and second oscillation circuits comprises elements having different characteristics from each other and configured to generate the first and second oscillation signals having different frequencies, respectively.

11. The test device according to claim 10, wherein the frequency division unit comprises:

a division section configured to divide the first oscillation signal at the first division ratio to generate a first divided signal and divide the second oscillation signal at the second division ratio to generate a second divided signal; and a selection section configured to selectively output the first or second divided signal as the divided oscillation signal in response to the first and second test mode signals.

* * * * *